United States Patent
Lee

(10) Patent No.: US 7,453,387 B2
(45) Date of Patent: Nov. 18, 2008

(54) PULSE WIDTH MODULATION IN DIGITAL POWER AMPLIFIER

(75) Inventor: Jae-Wook Lee, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 11/698,532

(22) Filed: Jan. 26, 2007

(65) Prior Publication Data

US 2007/0176810 A1    Aug. 2, 2007

(30) Foreign Application Priority Data

Feb. 2, 2006    (KR) ...................... 10-2006-0009903

(51) Int. Cl.
*H03M 1/82* (2006.01)
(52) U.S. Cl. .................... 341/152; 341/150; 330/10
(58) Field of Classification Search ......... 341/150–170; 330/10, 251, 207
See application file for complete search history.

(56) References Cited

U.S. PATENT DOCUMENTS

| | | | |
|---|---|---|---|
| 5,901,176 A | | 5/1999 | Lewison .................. 375/238 |
| 5,959,501 A | * | 9/1999 | Chester .................. 341/53 |
| 6,014,055 A | * | 1/2000 | Chester .................. 330/10 |
| 6,124,757 A | * | 9/2000 | Newey .................. 330/10 |
| 6,606,044 B2 | | 8/2003 | Roeckner et al. ........... 341/143 |
| 7,078,964 B2 | * | 7/2006 | Risbo et al. ............. 330/10 |
| 7,180,365 B2 | * | 2/2007 | Lee et al. ............... 330/10 |
| 7,327,187 B2 | * | 2/2008 | Lee .................... 330/10 |

OTHER PUBLICATIONS

Korean Patent Application No. 1020040037778 to Lee et al., having Publication date of Dec. 1, 2005 (w/ English Abstract page).
Korean Patent Application No. 1020030015937 to Cho et al., having Publication date of Sep. 21, 2004 (w/ English Abstract page).
Japanese Patent Application No. 02-273597 to Takayuki, having Publication date of May 22, 1992 (w/ English Abstract page).

* cited by examiner

*Primary Examiner*—Lam T Mai
(74) *Attorney, Agent, or Firm*—Monica H. Choi

(57) ABSTRACT

For PWM (pulse width modulation), a counter generates a count signal by counting a clock signal $2^n$ times for one period of the count signal. A PWM circuit generates a PWM signal from an n-bit pulse code modulation (PCM) data. The PWM signal includes a first pulse and a second pulse that are symmetric within one period of the count signal for positive and negative values of the n-bit PCM data. A same pulse width for the first and second pulses is determined by a respective value of each bit of the n-bit PCM data excluding the most and least significant bits of the n-bit PCM data.

21 Claims, 8 Drawing Sheets

| INTEGER VALUE | RECEIVED N-BIT PCM DATA | MODIFIED N-BIT PCM DATA |
|---|---|---|
| -1 | 1111 | 0010 |
| -2 | 1110 | 0011 |
| -3 | 1101 | 0100 |
| -4 | 1100 | 0101 |
| -5 | 1011 | 0110 |
| -6 | 1010 | 0111 |
| -7 | 1001 | 1000 |
| -8 | 1000 | 1001 |

PULSE WIDTH MODULATION IN DIGITAL POWER AMPLIFIER

BACKGROUND OF THE INVENTION

This application claims priority to Korean Patent Application No. 2006-09903, filed on Feb. 2, 2006 in the Korean Intellectual Property Office, the disclosure of which is incorporated herein in its entirety by reference.

1. Field of the Invention

The present invention relates generally to pulse width modulation, and more particularly to pulse width modulation with improved signal-to-noise ratio and total harmonic distortion in a digital power amplifier.

2. Background of the Invention

A pulse width modulation (PWM) circuit of a digital power amplifier generally receives pulse-code-modulated digital audio data, that is, pulse code modulation (PCM) data. The PCM data may be directly modulated to a PWM signal in a digital domain, or may be modulated to the PWM signal after reducing a number of bits of the PCM data using sigma-delta modulation (SDM) and the like.

A PWM method includes controlling an amplitude of an output signal according to duty cycle of the PWM signal. The PWM method is synchronized according to an input period of PCM data or a switching period of a class D amplifier switched by the PWM signal. In addition, a pulse generated by the PWM method may be symmetric or asymmetric based on the center of the switching period.

FIGS. 1 and 2 are timing diagrams illustrating conventional PWM methods. FIG. 1 shows 4-bit PCM data having a value from "−8" to "7". A count signal is generated from counting from "−8" (1000) to "+7" (0111), and a period of the count signal corresponds to a switching period of a PWM signal. The count signal is comprised of sixteen time intervals with each time interval being for each count from "−8" (1000) to "+7" (0111).

The center of the count signal is at the beginning of when the count signal corresponds to "0" (0000). An asymmetric PWM signal is at a logic high state for eight time intervals to the left of the center of the count signal, and is at a logic low state for eight time intervals to the right of the center of the count signal. A symmetric PWM signal is at the logic high state for four time intervals respectively to the left and right of the center of the count signal, and is at the logic low state for the other eight time intervals. The symmetric PWM signal typically has less switching noise in comparison with the asymmetric PWM signal.

FIG. 2 shows 3-bit PCM data having a value from "−4" (100) to "+3" (011) and a count signal similar to FIG. 1. In FIG. 2, a PWM signal is input twice and is switched twice in one period of the count signal. Thus, a switching frequency is doubled, and noise due to the switching frequency may be decreased in an audio frequency band.

A PWM method in FIG. 2 includes reducing a number of bits of the PCM data and raising the switching frequency. Thus, the PWM signal according to the PWM method of FIG. 2 may have a high signal-to-noise ratio (SNR) and a low total harmonic distortion (THD) in comparison with the PWM method of FIG. 1. However, quantization error of the PWM signal of FIG. 2 may be larger than the PWM signal of FIG. 1.

Korean Patent Laid-Open Publication No. 2005-112649 discloses a PWM method in which a period of PCM data is the same as a period of a count signal, and in which a switching period of a generated PWM signal is twice the period of the count signal. According to that PWM method, the number of bits of the PCM data is maintained and the switching period of the PWM signal is raised so that quantization error of the PWM signal may be maintained and the PWM signal may have a relatively high SNR and a low THD.

However, according to the method disclosed in Korean Patent Laid-Open Publication No. 2005-112649, two PWM pulses generated from one PCM data may have pulse widths that are different from each other, so that noise may result due to these asymmetric pulses.

SUMMARY OF THE INVENTION

Accordingly, a pulse width modulation method and apparatus according to the present invention results in high signal-to-noise ratio (SNR) and a low total harmonic distortion (THD) while maintaining symmetry of a PWM signal.

For an apparatus and method for PWM (pulse width modulation) according to an aspect of the present invention, a counter generates a count signal by counting a clock signal $2^n$ times for one period of the count signal. In addition, a PWM (pulse width modulation) circuit generates a PWM (pulse width modulation) signal from an n-bit pulse code modulation (PCM) data. The PWM signal includes a first pulse and a second pulse that are symmetric within one period of the count signal for positive and negative values of the n-bit PCM data. A same pulse width for the first and second pulses is determined by a respective value of each bit of the n-bit PCM data excluding a most significant bit and a least significant bit of the n-bit PCM data.

In one embodiment of the present invention, n is a natural number that is at least four. The same pulse width represents two possible integers of the n-bit PCM data since the least significant bit is not used for determining the same pulse width. In addition, the most significant bit of the n-bit PCM data indicates whether the n-bit PCM data represents a positive or negative value.

In another embodiment of the present invention, the period of the count signal is comprised of $2^n$ time intervals. In that case, when the n-bit PCM data represents a positive value, the PWM circuit increases the same pulse width by x multiples of the time interval when an x-bit place from the least significant bit of the n-bit PCM data has a predetermined bit value with the first and second pulses remaining symmetric about a center point of the period of the count signal.

In a further embodiment of the present invention, when the n-bit PCM data represents a negative value, the PWM circuit complements each bit of the n-bit PCM data and adds a high bit at a second least significant bit place to generate a modified n-bit PCM data. Additionally, the PWM circuit decreases the same pulse width by x multiples of the time interval when an x-bit place from the least significant bit of the modified n-bit PCM data has a predetermined bit value with the first and second pulses remaining symmetric about a center point of the period of the count signal.

Also when the n-bit PCM data represents a negative value, the PWM circuit generates the PWM signal to be flat without the first and second pulses when the modified n-bit PCM data has predetermined values.

The PWM apparatus and method may be used to particular advantage in a digital power amplifier further including a PWM (pulse width modulation) amplifying circuit for generating a current that drives a load according to the PWM signal. Such a digital power amplifier according to another embodiment of the present invention includes a SDM (sigma-delta-modulation) circuit for sigma-delta-modulating an m-bit (pulse code modulation) PCM data to generate the n-bit PCM data.

The digital power amplifier according to a further embodiment of the present invention is a class D amplifier that may also include a low-pass filter.

In this manner, the least significant bit of the n-bit PCM data is not used for generating the PWM signal that is symmetric within the period of the count signal for reducing nose. The PWM signal is thus generated with high signal-to-noise ratio (SNR) and low total harmonic distortion (THD).

BRIEF DESCRIPTION OF THE DRAWINGS

The above and other features and advantages of the present invention will become more apparent when described in detailed exemplary embodiments thereof with reference to the attached drawings in which.

The figures referred to herein are drawn for clarity of illustration and are not necessarily drawn to scale. Elements having the same reference number in FIGS. 1, 2, 3, 4, 5, 6A, 6B, 7, 8, and 9 refer to elements having similar structure and/or function.

DETAILED DESCRIPTION OF THE INVENTION

Figure 1:
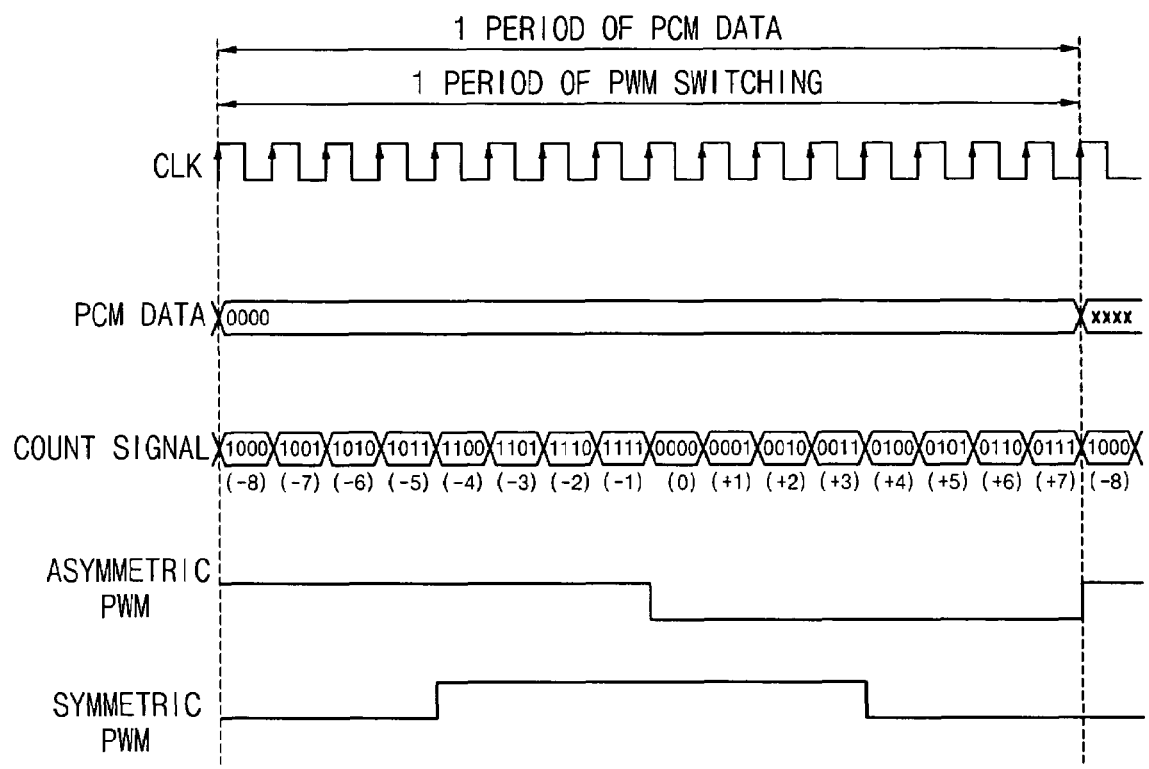
FIGS. 1 and 2 are timing diagrams illustrating conventional pulse width modulation (PWM) methods.
Figure 2:
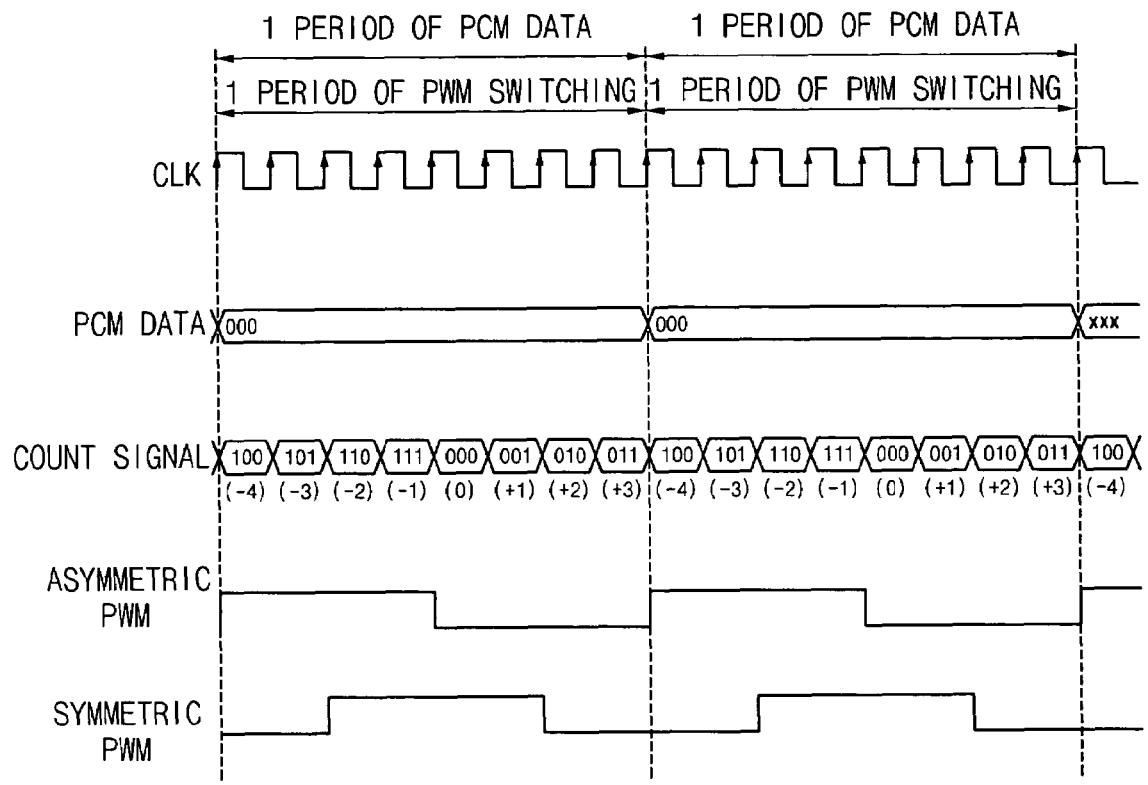

Embodiments of the present invention are now described more fully with reference to the accompanying drawings. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like reference numerals refer to like elements throughout this application.

It will be understood that, although the terms first, second, etc. may be used herein to describe various elements, these elements should not be limited by these terms. These terms are used to distinguish one element from another. For example, a first element could be termed a second element, and, similarly, a second element could be termed a first element, without departing from the scope of the present invention. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion e.g., "between" versus "directly between," "adjacent" versus "directly adjacent," etc.

The terminology used herein is for the purpose of describing particular embodiments and is not intended to be limiting of the invention. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements, and/or components, but do not preclude the presence or addition of one or more other features, integers, steps, operations, elements, components, and/or groups thereof.

Unless otherwise defined, all terms including technical and scientific terms used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Generally for pulse width modulation (PWM), an audio signal is received, and an output signal (i.e., a PWM signal) is generated having a pulse width or a duty ratio proportional to the amplitude of the audio signal. For example, when the audio signal corresponds to an analog value "0" or 4-bit PCM (pulse code modulation) data "0000", the output signal may have a 50% duty ratio.

When the audio signal represents a positive analog value, the 4-bit PCM data is expressed as "0xxx" with x being "0" or "1". A bit of the PCM data being "0" indicates a logic low state, and a bit of the PCM data being "1" indicates a logic high state. The most significant bit of the PCM data being "0" indicates that the PCM data represents a positive value. In that case, the PWM signal is generated to have a duty ratio greater than 50%. In contrast, when the audio signal represents a negative analog value, the 4-bit PCM data is expressed as "1xxx" with the most significant bit being "1". In that case, the PWM signal is generated to have a duty ratio less than 50%.

Figure 5:
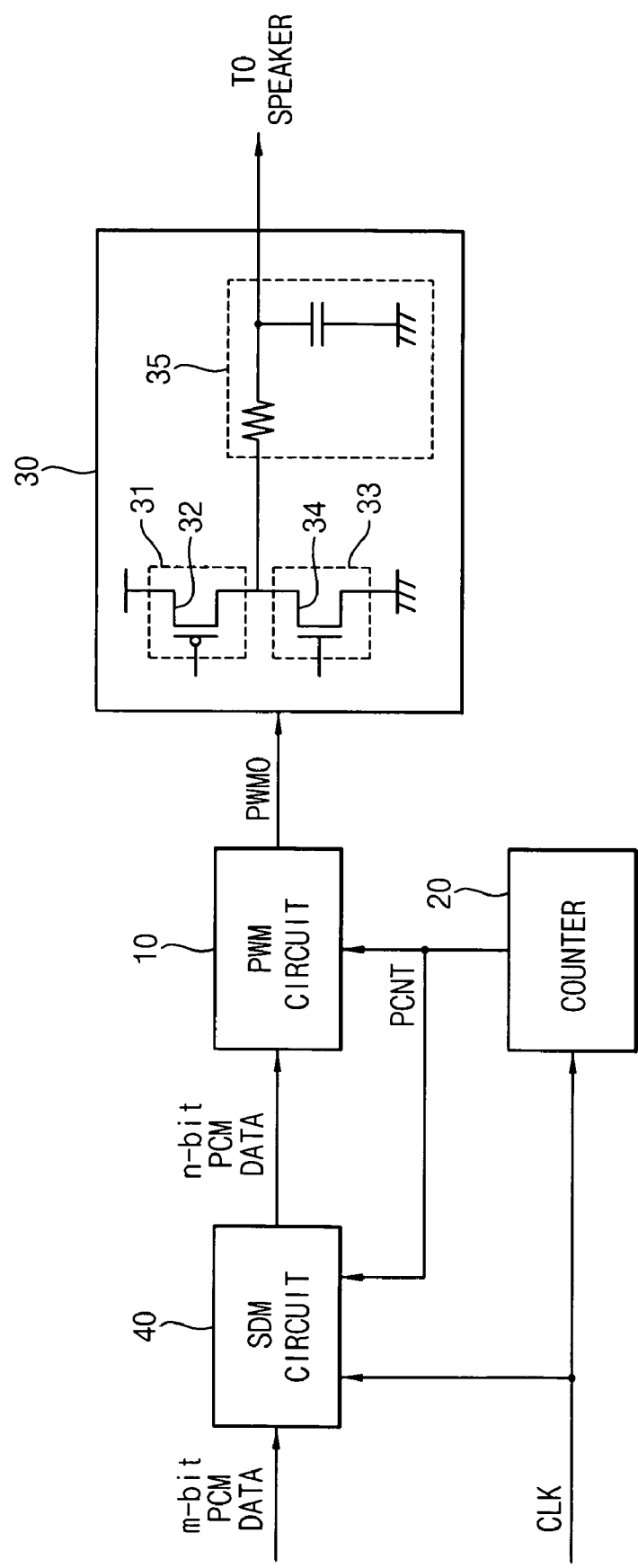
FIG. 5 is a block diagram of a digital power amplifier with a PWM apparatus according to an embodiment of the present invention.

FIG. 5 is a block diagram of a digital power amplifier according to an example embodiment of the present invention. Referring to FIG. 5, the digital power amplifier includes a PWM circuit 10, a counter 20, a PWM amplifier 30, and a sigma-delta modulation (SDM) circuit 40.

The counter 20 generates a count signal PCNT that counts $2^n$ time intervals with each time interval being a cycle of a clock signal CLK. The count signal PCNT is provided to the SDM circuit 40 and the PWM circuit 10. The SDM circuit 40 and the counter 20 are each provided with the clock signal CLK to operate in synchronization with the clock signal CLK.

The SDM circuit 40 receives an m-bit PCM data from a digital signal processing (DSP) circuit (not shown). The SDM circuit 40 sigma delta modulates the m-bit PCM data based on the count signal PCNT to generate an n-bit PCM data. m and n are respective natural numbers, and n is less than m. For example, 16-bit PCM data having audio quality of a compact disc (CD) level may be modulated to 5-bit or 4-bit PCM data by sigma delta modulation. Such SDM circuits individually and in general are known to one of ordinary skill in the art.

The present invention may also be practiced without any SDM circuit 40 in the digital power amplifier of FIG. 5. In that case, the m-bit data may be directly pulse width modulated by the PWM circuit 10. However in that case, a high-performance DSP logic may be required to directly perform pulse width modulation for the 44.8 kHz, 16-bit PCM data for example. Use of the SDM circuit 40 significantly reduces the number of bits to be pulse width modulated without much noise in an audio frequency band. Thus, although audio quality may be degraded, the size of the digital power amplifier and the power consumption may be decreased by using the SDM circuit 40.

The PWM circuit 10 pulse width modulates the n-bit PCM data based on the count signal PCNT to generate a PWM (pulse width modulation) output signal PWMO. The PWM amplifier 30 outputs an amplified current for driving a speaker according to the PWM output signal PWMO. In an example embodiment of the present invention, the PWM amplifier 30 is a class D amplifier including a pull-up device 31 and a pull-down device 33.

The pull-up device 31 and the pull-down device 33 are switched according to the PWM output signal PWMO, respectively. The pull-up device is a p-type metal-oxide semiconductor (PMOS) transistor 32, and the pull-down device 33 is an n-type metal-oxide semiconductor (NMOS) transistor 34, in an example embodiment of the present invention. The PWM amplifier 30 further includes a low-pass filter 35 coupled to an output terminal of the class D amplifier in one embodiment of the present invention.

Figures 7, 8:
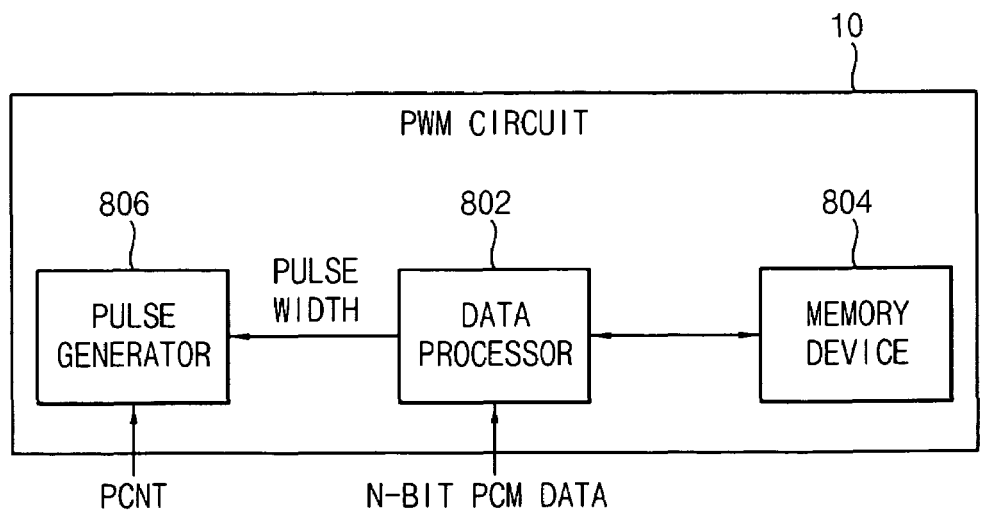
FIG. 7 shows a table of received and modified n-bit PCM data when the received PCM data represents a negative value for the PWM apparatus and method according to an embodiment of the present invention.
FIG. 8 shows a block diagram of an example PWM circuit in FIG. 5, according to an example embodiment of the present invention.
Figure 9:
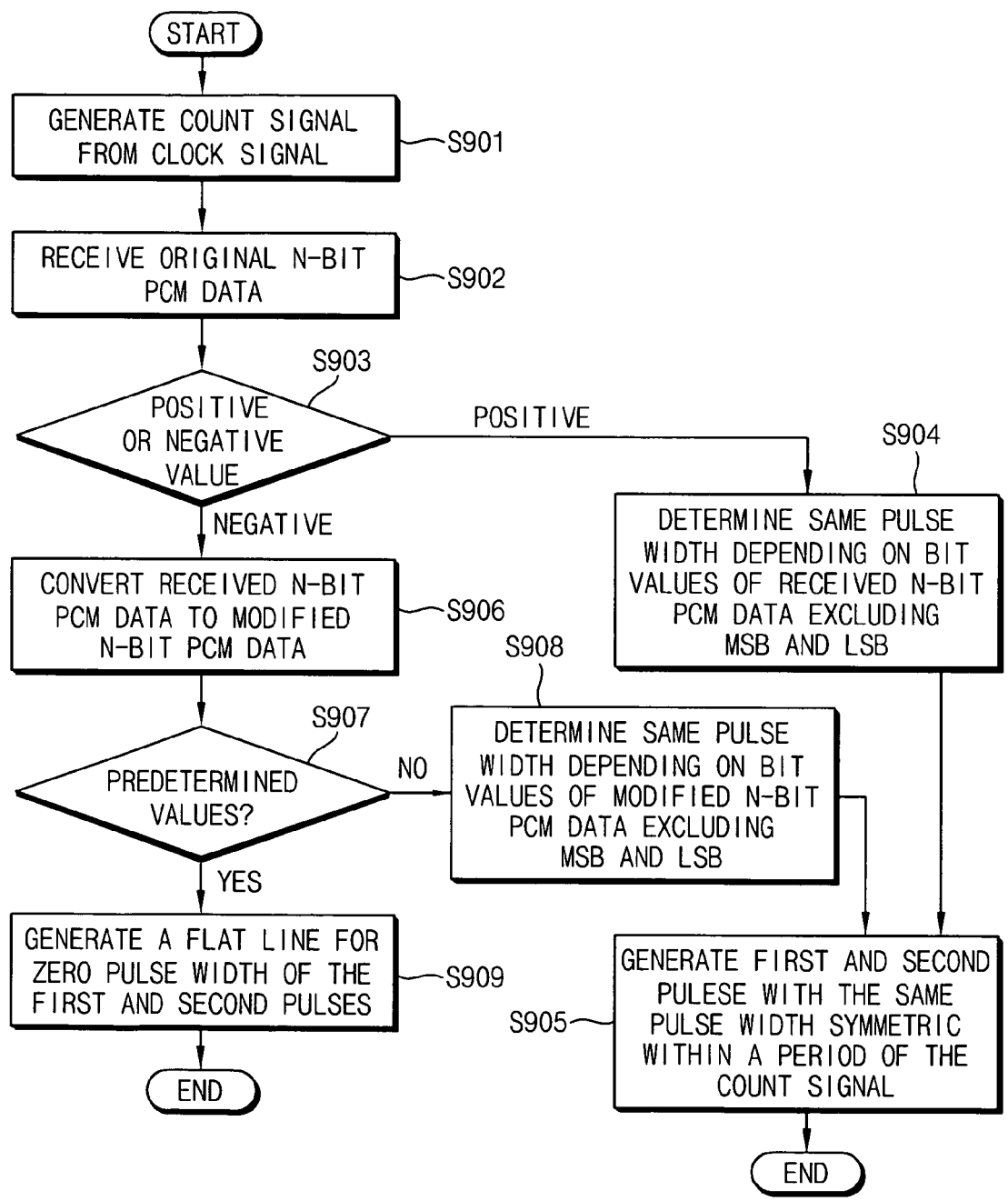
FIG. 9 shows a flow-chart of steps during operation of the PWM circuit of FIG. 8 according to an example embodiment of the present invention.

FIG. 8 shows a block diagram of the PWM circuit 10 according to an example embodiment of the present invention. FIG. 9 shows a flow-chart of steps during operation of the PWM circuit 10 for generating the PWM signal PWMO, according to an example embodiment of the present invention.

Referring to FIG. 8, the PWM circuit 10 includes a data processor 802, a memory device 804, and a pulse generator 806. The memory device 804 has sequences of instructions (i.e., software) stored therein, and execution of such sequences of instructions by the data processor 802 causes the data processor 802 to perform the steps of the flow-chart of FIG. 9 for determining a same pulse width of first and second pulses of the PWMO signal generated by the pulse generator 806.

In FIG. 8, the data processor 802 determines the proper same pulse width for the first and second pulses of the PWM signal. The pulse generator 806 then generates the PWM signal with the first and second pulses having such a same pulse width as determined by the data processor 802 according to the steps of the flowchart of FIG. 9.

However, note that the present invention may also be practiced with other implementations for the PWM circuit 10. Operation of the PWM circuit 10 for generating the PWMO signal is now described.

Figure 3:
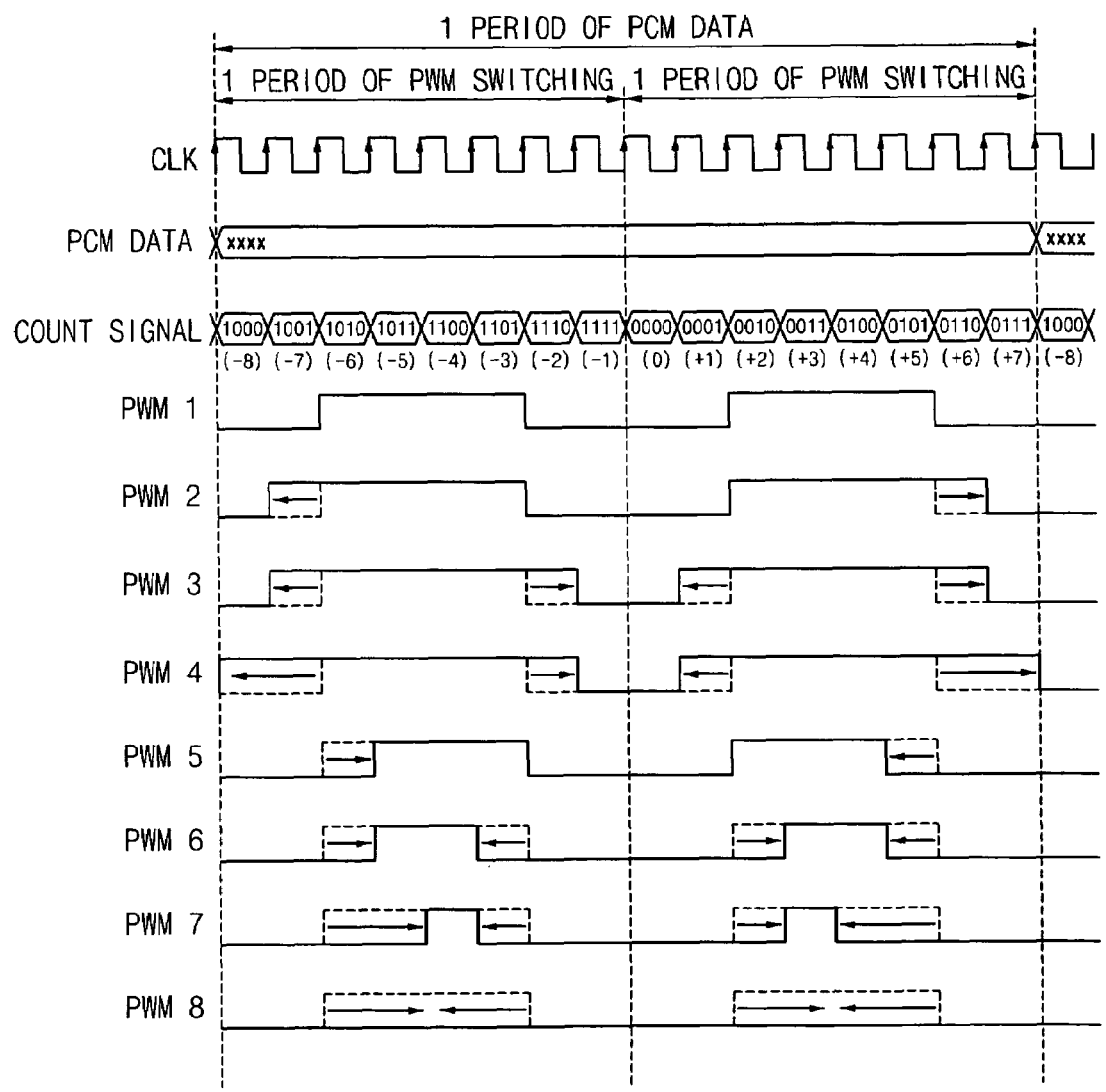
FIGS. 3 and 4 are timing diagrams illustrating PWM methods according to example embodiments of the present invention.
Figure 4:
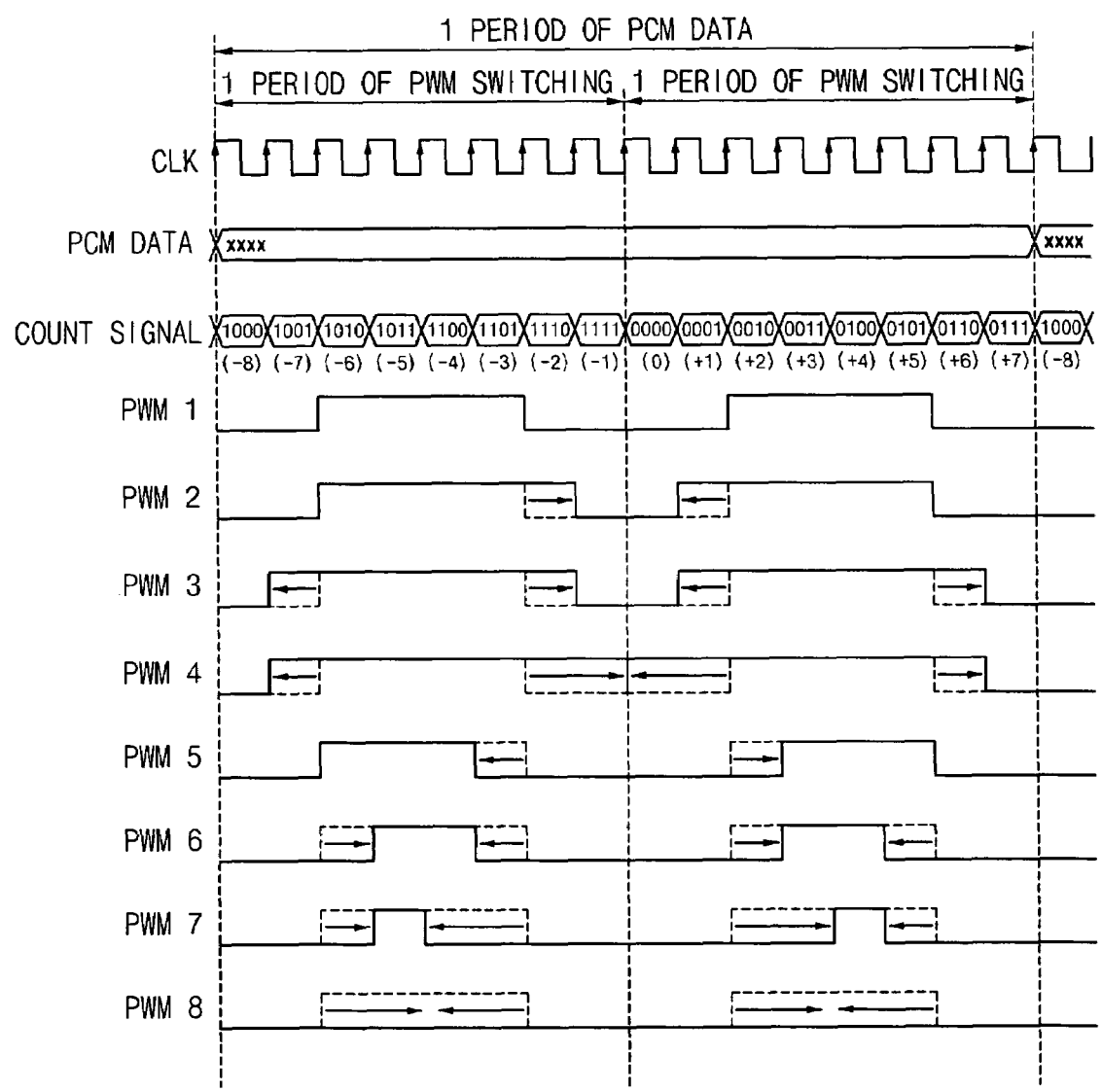

FIGS. 3 and 4 are timing diagrams of signals during operation of the digital power amplifier of FIG. 5 according to example embodiments of the present invention. In FIGS. 3 and 4, the PCM data and the count signal include 4-bits for simplicity and clarity of illustration and description. However, the present invention may be generalized to any number (i.e., n-bits with n being a natural number that is at least four) of bits for the PCM data and the count signal.

Referring to FIGS. 3, 4, 5, 8, and 9, one period of a count signal is generated by counting sequentially by one bit from "−8" (1000) to "+7" (0111) with the clock signal CLK (step S901 of FIG. 9). Thus, one period of the count signal is comprised of sixteen time intervals with each time interval being one cycle of the clock signal CLK.

A 4-bit PCM (pulse code modulation) data is applied at the beginning of the period of the count signal when the count signal corresponds to "−8" (1000). The next PCM data is applied when the count signal corresponds to "−8" (1000) again after "+7" (0111). Negative values of the PCM data and the count signal are expressed in two's complement.

Referring to FIGS. 3 and 4, a PWM (pulse width modulation) signal (i.e., the PWMO signal) generated from the PWM circuit 10 includes a first pulse and a second pulse that are generated to be symmetric about a center of the period of the count signal. Such a center is before the count is "0000" in FIGS. 3 and 4.

In one embodiment of the present invention, a reference PWM signal PWM1 is used for the case when the PCM data corresponds to "0" (0000). In that case, the PWM signal includes the first pulse which has the logic high state for the third through sixth unit time intervals of the count signal. Also in that case, the second pulse has the logic high state for the eleventh through fourteenth unit time intervals of the count signal.

The first pulse of each PWM signal is generated within the first half of the count signal, and the second pulse of each PWM signal is generated within the second half of the count signal. The first and second pulses are desired to be symmetric about the center of the period of the count signal. Thus, the first and second pulses have a same pulse width. The PWM signal corresponding to other PCM data aside from the PCM data corresponding to "0" (0000) is generated by extending or reducing the same reference pulse width of the first and second pulses for the reference PWM signal PWM1.

Steps S902, S903, S904, S905, S906, S907, and S908 of FIG. 9 are for determining such a same pulse width of the first and second pulses for any value of the 4-bit PCM data. Referring to FIGS. 8 and 9, the data processor 802 receives the 4-bit PCM data (step S902 of FIG. 9).

The data processor 802 then determines whether the received 4-bit PCM data is for a positive value or a negative value (step S903 of FIG. 9) from the most significant bit of the received 4-bit PCM data. If the most significant bit of the received 4-bit PCM data is "0", the received 4-bit PCM data is for a positive value. If the most significant bit of the received 4-bit PCM data is "1", the received 4-bit PCM data is for a negative value.

If the received 4-bit PCM data is for a positive value, the same pulse width for the first and second pulses is determined depending on the bit values of the received 4-bit PCM data, excluding the most significant bit and the least significant bit of the received 4-bit PCM data (step S904 of FIG. 9). In particular in that case, the same pulse width is determined by extending by x-times the unit time interval of the count signal from the reference pulse width, with x being the respective number of bit places from the least significant bit of the 4-bit PCM data for each bit of the 4-bit PCM data having the logic high state "1" but excluding the most and least significant bits of the 4-bit PCM data.

For example, the first PWM signal PWM1 is for when the 4-bit PCM data corresponds to "0" (0000) or "+1" (0001). In that case, all of the bit values between the most significant bit and the least significant bit are zero. Thus, the same pulse width just remains the reference pulse width such that the reference PWM signal PWM1 is generated.

As another example, a second PWM signal PWM2 is for when the 4-bit PCM data corresponds to "+2" (0010) or "+3" (0011). In that case, only the bit value that is one bit-place removed from the least significant bit between the most and least significant bits has the logic high state "1". Thus, the same pulse width of the first and second pulses is determined by extending by one time interval from the reference pulse width of the reference PWM1 signal. For generating the PWM2 signal, one unit time interval is extended before the first pulse and after the second pulse of the reference PWM1 signal, as illustrated in FIG. 3.

However, the present invention may also be practiced with the PWM2 signal being generated by extending by one unit time interval after the first pulse and before the second pulse of the reference PWM 1 signal, as illustrated in FIG. 4. In either case of FIG. 3 or 4, the first and second pulses of the PWM2 signal remain symmetric about the center of the period of the count signal (step S905 of FIG. 9).

As another example, a third PWM signal PWM3 is for when the 4-bit PCM data corresponds to "+4" (0100) or "+5" (0101). In that case, only the bit value that is two bit-places removed from the least significant bit between the most and least significant bits has the logic high state "1". Thus, the same pulse width of the first and second pulses is determined by extending by two unit time intervals from the reference pulse width of the reference PWM1 signal.

For generating the PWM3 signal, a respective unit time interval is extended both before and after the first pulse and before and after the second pulse of the reference PWM1 signal, as illustrated in FIGS. 3 and 4. In either case of FIG. 3 or 4, the first and second pulses of the PWM2 signal remain symmetric about the center of the period of the count signal (step S905 of FIG. 9).

As another example, a fourth PWM signal PWM4 is for when the 4-bit PCM data corresponds to "+6" (0110) or "+7" (0111). In that case, both a first bit value that is one bit-place removed and a second bit value that is two bit-places removed from the least significant bit between the most and least significant bits has the logic high state "1". Also in that case, the same pulse width of the first and second pulses is determined by the combination of the extensions for the second and third PWM signals PWM2 and PWM3.

Thus, in FIG. 3, the PWM4 signal is generated when two unit time intervals are extended before the first pulse, one unit time interval is extended after the first pulse, one unit time interval is extended before the second pulse, and two unit time intervals are extended after the second pulse. Similarly in FIG. 4, the PWM4 signal is generated when one unit time interval is extended before the first pulse, two unit time intervals are extended after the first pulse, two unit time intervals are extended before the second pulse, and one unit time interval is extended after the second pulse. In either case of FIG. 3 or 4, the first and second pulses of the PWM4 signal remain symmetric about the center of the period of the count signal (step S905 of FIG. 9).

The PWM1, PWM2, PWM3, and PWM4 signals are for when the 4-bit PCM data corresponds to a positive value. Referring back to step 903 of FIG. 9, when the 4-bit PCM data corresponds to a negative value, the data processor 802 converts the received 4-bit PCM data to a modified 4-bit PCM data (step S906 of FIG. 9).

FIG. 7 shows a table illustrating examples of the modified 4-bit PCM data converted from a respective received 4-bit PCM data. Generally for generating the modified 4-bit PCM data, each bit of the received 4-bit PCM data is complemented and "0010" is added to such a complement.

The data processor 802 then determines whether such a modified 4-bit PCM data is any of predetermined values for generating a flat line for the PWM signal (steps S907 and S908 of FIG. 9). In the example of FIGS. 3 and 4, the predetermined values of the modified 4-bit PCM data are 1000 and 1001 for when the received 4-bit PCM data corresponds to "−7" (1001) or "−8" (1000). For such 4-bit PCM data, a flat line of the eighth PWM signal PWM8 is generated in FIGS. 3 and 4.

When the modified 4-bit PCM data is not any of the predetermined values for generating a flat line for the PWM signal, the data processor determines the same pulse width for the first and second pulses of the PWM signal by the bit values of the modified 4-bit PCM data, excluding the most and least significant bits of the modified 4-bit PCM data (step S908 of FIG. 9). In particular in that case, the same pulse width is determined by reducing by x-times the unit time interval of the count signal from the reference pulse width, with x being the respective number of bit places from the least significant bit of the modified 4-bit PCM data for each bit of the modified 4-bit PCM data having the logic high state "1" but excluding the most and least significant bits of the modified 4-bit PCM data.

For example, the fifth PWM signal PWM5 is for when the received 4-bit PCM data corresponds to "−1" (1111) or "−2" (1110) with the modified 4-bit PCM data being (0010) or (0011). In that case, only the bit value that is one bit-place removed from the least significant bit between the most and least significant bits of the modified 4-bit PCM data has the logic high state "1". Thus, the same pulse width of the first and second pulses is determined by reducing by one time interval from the reference pulse width of the reference PWM1 signal. For generating the PWM5 signal, one unit time interval is reduced before the first pulse and after the second pulse of the reference PWM1 signal, as illustrated in FIG. 3.

However, the present invention may also be practiced with the PWM5 signal being generated by reducing by one unit time interval after the first pulse and before the second pulse of the reference PWM 1 signal, as illustrated in FIG. 4. In either case of FIG. 3 or 4, the first and second pulses of the PWM5 signal remain symmetric about the center of the period of the count signal (step S905 of FIG. 9).

As another example, a sixth PWM signal PWM6 is for when the 4-bit PCM data corresponds to "−3" (1101) or "−4" (1100) with the modified 4-bit PCM data being (0100) or (0101). In that case, only the bit value that is two bit-places removed from the least significant bit between the most and least significant bits of the modified 4-bit PCM data has the logic high state "1". Thus, the same pulse width of the first and second pulses of the PWM6 signal is determined by reducing by two unit time intervals from the reference pulse width of the reference PWM1 signal.

For generating the PWM6 signal, a respective unit time interval is reduced both before and after the first pulse and before and after the second pulse of the reference PWM1 signal, as illustrated in FIGS. 3 and 4. In either case of FIG. 3 or 4, the first and second pulses of the PWM6 signal remain symmetric about the center of the period of the count signal (step S905 of FIG. 9).

As a further example, a seventh PWM signal PWM7 is for when the 4-bit PCM data corresponds to "−5" (1011) or "−6" (1010) with the modified 4-bit PCM data being (0110) or (0111). In that case, both a first bit value that is one bit-place removed and a second bit value that is two bit-places removed from the least significant bit between the most and least significant bits of the modified 4-bit PCM has the logic high state "1". Also in that case, the same pulse width of the first and second pulses is determined by the combination of the reductions for the fifth and sixth PWM signals PWM5 and PWM6.

Thus, in FIG. 3, the PWM7 signal is generated when two unit time intervals are reduced before the first pulse, one unit time interval is reduced after the first pulse, one unit time interval is reduced before the second pulse, and two unit time intervals are reduced after the second pulse. Similarly in FIG. 4, the PWM7 signal is generated when one unit time interval is reduced before the first pulse, two unit time intervals are reduced after the first pulse, two unit time intervals are reduced before the second pulse, and one unit time interval is reduced after the second pulse. In either case of FIG. 3 or 4, the first and second pulses of the PWM7 signal remain symmetric about the center of the period of the count signal (step S905 of FIG. 9).

In this manner, in either of FIG. 3 or 4, each of the PWM1, PWM2, PWM3, PWM4, PWM5, PWM6, PWM7, and PWM8 signals represent two 4-bit PCM data since the least significant bit is not represented in such signals. Such signals remain symmetric about the center of the period of the count signal for reducing noise.

Figure 6A:
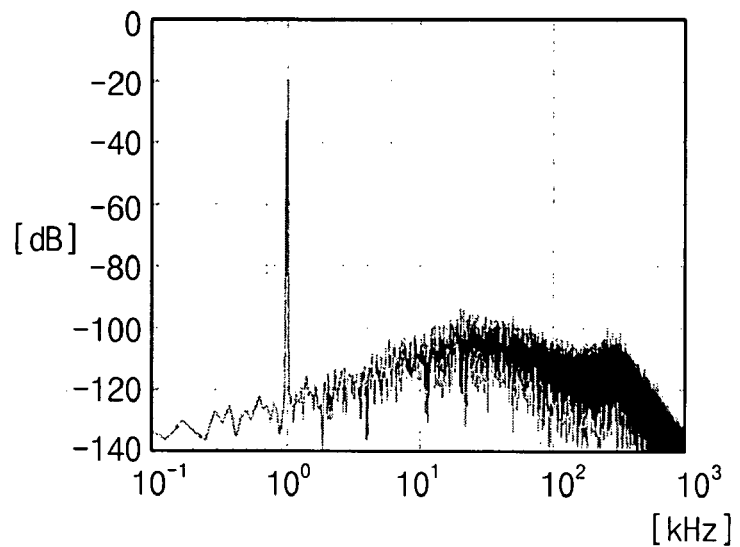
FIG. 6A is a graph illustrating noise of a PWM signal generated by a conventional PWM method.
Figure 6B:
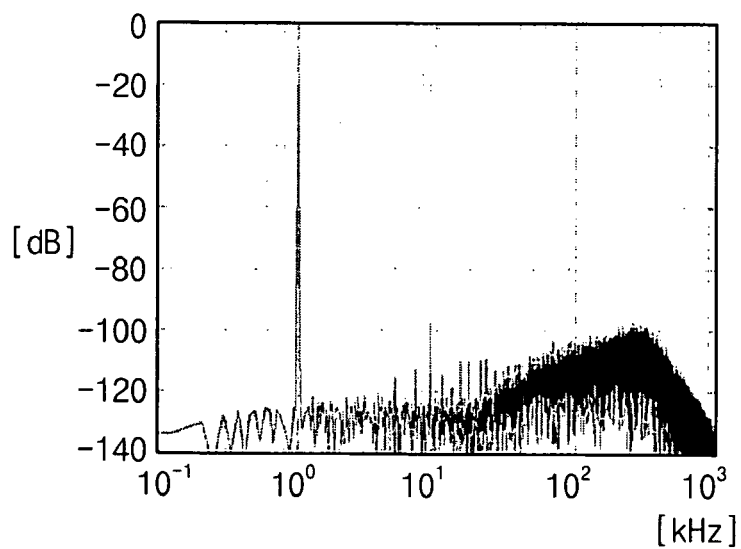
FIG. 6B is a graph illustrating noise of a PWM signal generated by a PWM method according to example embodiments of the present invention.

FIG. 6A is a graph illustrating noise of a PWM signal generated according to the prior art. FIG. 6B is a graph illustrating noise of a PWM signal generated according to embodiments of the present invention. The PCM data and the count signal that are provided to the PWM circuit 10 are for 4-bits, and the PCM data provided to the SDM circuit 40 is for 16-bits by sampling an audio signal of 1 kHz to 48 kHz. In FIGS. 6A and 6B, a horizontal axis indicates a log-scale frequency expressed in kilohertz (kHz), and a vertical axis indicates the PWM signal expressed in decibels (dB).

Referring to FIGS. 6A and 6B, audio signals correspond to about −20 dB, and a maximum noise level at around 192 kHz corresponds to about −100 dB. However, the noise due to a sampling frequency may have little influence in an audio frequency band, that is, from 20 Hz to 20 kHz.

Referring to FIG. 6A, the PWM signal has a maximum noise level of about −95 dB at around 24 kHz. The noise results from asymmetry of the PWM signal that depends on the least significant bit of the PCM data in the prior art. An SNR at 10 kHz is only about 80 dB in comparison with the audio signal of about −20 dB. The human auditory sense is acute with respect to high-pitched noises of the audio frequency band, so that the PWM signal generated according to the prior art may considerably influence audio quality.

Referring to FIG. 6B, the PWM signal has a noise level of about −120 dB at around 24 kHz. An SNR of the whole audio frequency band is about 105 dB in comparison with the audio signal of about −20 dB, so that the PWM signal generated according to embodiments of the present invention may be superior by as much as about 10 dB to about 20 dB than the PWM signal generated according to the prior art. Although the least significant value of the PCM data is not considered for generating the PWM signal according to the present invention, the audio signal may be hardly distorted.

In this manner, the least significant bit of the PCM data is not considered in generating the PWM signal such that the number of bits for generating the count signal is not increased while generating two pulses for the PWM signal during one period of the count signal. With such two pulses that are symmetric within the period of the count signal, switching noise may be decreased in an audio frequency band, SNR may be largely improved, and variations in audio quality may be reduced. In addition, using the SDM circuit 40 may reduce the number of bits processed by the PWM circuit 10 so that sampling noise may be decreased in the audio frequency band and SNR may be improved.

While the example embodiments of the present invention and their advantages have been described in detail, it should be understood that various changes, substitutions, and alterations may be made herein without departing from the scope of the invention.

What is claimed is:

1. A pulse width modulation (PWM) method, comprising:
   generating a count signal by counting a clock signal $2^n$ times for one period of the count signal;
   receiving an n-bit pulse code modulation (PCM) data; and
   generating a PWM (pulse width modulation) signal including a first pulse and a second pulse that are symmetric within one period of the count signal for positive and negative values of the n-bit PCM data, wherein a same pulse width for the first and second pulses is determined by a respective value of each bit of the n-bit PCM data excluding a most significant bit and a least significant bit of the n-bit PCM data.

2. The PWM method of claim 1, wherein n is a natural number that is at least four, and wherein the same pulse width represents two possible integers of the n-bit PCM data.

3. The PWM method of claim 1, wherein the most significant bit of the n-bit PCM data indicates whether the n-bit PCM data represents a positive or negative value.

4. The PWM method of claim 3, wherein the period of the count signal is comprised of $2^n$ time intervals, and wherein when the n-bit PCM data represents a positive value, the method further includes:
   increasing the same pulse width by x multiples of the time interval when an x-bit place from the least significant bit of the n-bit PCM data has a predetermined bit value, with the first and second pulses remaining symmetric about a center point of the period of the count signal.

5. The PWM method of claim 3, wherein the period of the count signal is comprised of $2^n$ time intervals, and wherein when the n-bit PCM data represents a negative value, the method further includes:
   complementing each bit of the n-bit PCM data and adding a high bit at a second least significant bit place to generate a modified n-bit PCM data; and
   decreasing the same pulse width by x multiples of the time interval when an x-bit place from the least significant bit of the modified n-bit PCM data has a predetermined bit value, with the first and second pulses remaining symmetric about a center point of the period of the count signal.

6. The PWM method of claim 5, further comprising:
   generating the PWM signal to be flat without the first and second pulses when the modified n-bit PCM data has predetermined values.

7. An apparatus for PWM (pulse width modulation), comprising:
   a counter for generating a count signal by counting a clock signal $2^n$ times for one period of the count signal; and
   a PWM (pulse width modulation) circuit for generating a PWM (pulse width modulation) signal from an n-bit pulse code modulation (PCM) data, the PWM signal including a first pulse and a second pulse that are symmetric within one period of the count signal for positive and negative values of the n-bit PCM data, wherein a same pulse width for the first and second pulses is determined by a respective value of each bit of the n-bit PCM data excluding a most significant bit and a least significant bit of the n-bit PCM data.

8. The apparatus of claim 7, wherein n is a natural number that is at least four, and wherein the same pulse width represents two possible integers of the n-bit PCM data.

9. The apparatus of claim 7, wherein the most significant bit of the n-bit PCM data indicates whether the n-bit PCM data represents a positive or negative value.

10. The apparatus of claim 9, wherein the period of the count signal is comprised of $2^n$ time intervals, and wherein when the n-bit PCM data represents a positive value, the PWM circuit increases the same pulse width by x multiples of the time interval when an x-bit place from the least significant bit of the n-bit PCM data has a predetermined bit value, with the first and second pulses remaining symmetric about a center point of the period of the count signal.

11. The apparatus of claim 9, wherein the period of the count signal is comprised of 2time intervals, and wherein when the n-bit PCM data represents a negative value, the PWM circuit complements each bit of the n-bit PCM data and adds a high bit at a second least significant bit place to generate a modified n-bit PCM data, and wherein the PWM circuit decreases the same pulse width by x multiples of the time interval when an x-bit place from the least significant bit of the modified n-bit PCM data has a predetermined bit value, with the first and second pulses remaining symmetric about a center point of the period of the count signal.

12. The apparatus of claim 11, wherein the PWM circuit generates the PWM signal to be flat without the first and second pulses when the modified n-bit PCM data has predetermined values.

13. A digital power amplifier comprising:
a counter for generating a count signal by counting a clock signal $2^n$ times for one period of the count signal;
a PWM (pulse width modulation) circuit for generating a PWM (pulse width modulation) signal from an n-bit pulse code modulation (PCM) data, the PWM signal including a first pulse and a second pulse that are symmetric within one period of the count signal for positive and negative values of the n-bit PCM data, wherein a same pulse width for the first and second pulses is determined by a respective value of each bit of the n-bit PCM data excluding a most significant bit and a least significant bit of the n-bit PCM data; and
a PWM (pulse width modulation) amplifying circuit for generating a current that drives a load according to the PWM signal.

14. The digital power amplifier of claim 13, wherein n is a natural number that is at least four, and wherein the same pulse width represents two possible integers of the n-bit PCM data.

15. The digital power amplifier of claim 13, wherein the most significant bit of the n-bit PCM data indicates whether the n-bit PCM data represents a positive or negative value.

16. The digital power amplifier of claim 15, wherein the period of the count signal is comprised of $2^n$ time intervals, and wherein when the n-bit PCM data represents a positive value, the PWM circuit increases the same pulse width by x multiples of the time interval when an x-bit place from the least significant bit of the n-bit PCM data has a predetermined bit value, with the first and second pulses remaining symmetric about a center point of the period of the count signal.

17. The digital power amplifier of claim 15, wherein the period of the count signal is comprised of $2^n$ time intervals, and wherein when the n-bit PCM data represents a negative value, the PWM circuit complements each bit of the n-bit PCM data and adds a high bit at a second least significant bit place to generate a modified n-bit PCM data, and wherein PWM circuit decreases the same pulse width by x multiples of the time interval when an x-bit place from the least significant bit of the modified n-bit PCM data has a predetermined bit value, with the first and second pulses remaining symmetric about a center point of the period of the count signal.

18. The digital power amplifier of claim 17, wherein the PWM circuit generates the PWM signal to be flat without the first and second pulses when the modified n-bit PCM data has predetermined values.

19. The digital power amplifier of claim 15, further comprising:
a SDM (sigma-delta-modulation) circuit for sigma-delta-modulating an in-bit (pulse code modulation) PCM data to generate the n-bit PCM data.

20. The digital power amplifier of claim 15, wherein the PWM amplifying circuit is a class D amplifier.

21. The digital power amplifier of claim 20, wherein the PWM amplifying circuit includes a low-pass filter.

* * * * *